United States Patent
Ecton et al.

(10) Patent No.: US 10,515,824 B2
(45) Date of Patent: Dec. 24, 2019

(54) ENHANCED ETCH ANISOTROPY USING NANOPARTICLES AS BANKING AGENTS IN THE PRESENCE OR ABSENCE OF A MAGNETIC OR ELECTRICAL FIELD

(71) Applicant: Intel Corporation, Santa Clara, CA (US)

(72) Inventors: Jeremy Ecton, Gilbert, TX (US); Leonel Arana, Phoenix, AZ (US); Nicholas S. Haehn, Scottsdale, AZ (US); Hsin-Wei Wang, Chandler, AZ (US); Oscar Ojeda, Chandler, AZ (US); Arnab Roy, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/868,942

(22) Filed: Jan. 11, 2018

(65) Prior Publication Data

US 2019/0214272 A1    Jul. 11, 2019

(51) Int. Cl.
| | |
|---|---|
| *H01L 21/321* | (2006.01) |
| *H01L 21/3213* | (2006.01) |
| *C23F 1/14* | (2006.01) |
| *H01L 21/48* | (2006.01) |

(52) U.S. Cl.
CPC .......... *H01L 21/32134* (2013.01); *C23F 1/14* (2013.01); *H01L 21/32139* (2013.01); *H01L 21/4846* (2013.01)

(58) Field of Classification Search
CPC .................................................. H01L 21/32134
USPC ........................................................... 216/47
See application file for complete search history.

(56) References Cited

U.S. PATENT DOCUMENTS

2006/0207888 A1 *    9/2006   Taylor .................... C25F 3/02
                                                                205/646

* cited by examiner

*Primary Examiner* — Roberts P Culbert
(74) *Attorney, Agent, or Firm* — Schwabe, Williamson & Wyatt P.C.

(57) ABSTRACT

A method of anisotropic etching comprises forming a metal layer above a substrate. A mask layer is formed on the metal layer with openings defined in the mask layer to expose portions of the metal layer. The exposed portions of the metal layer are introduced to an active etchant solution that includes nanoparticles as an insoluble banking agent. In further embodiments, the exposed portions of the metal layer are introduced to a magnetic and/or an electrical field.

24 Claims, 6 Drawing Sheets

ENHANCED ETCH ANISOTROPY USING NANOPARTICLES AS BANKING AGENTS IN THE PRESENCE OR ABSENCE OF A MAGNETIC OR ELECTRICAL FIELD

TECHNICAL FIELD

Embodiments of the disclosure are in the field of integrated circuit structures and, in particular, enhanced etch anisotropy using nanoparticles as banking agents both in the presence and absence of a magnetic or electrical field.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips.

The core patterning process in substrate manufacturing is approaching a fundamental limit in line/space resolution capability based on conventional technologies. Novel technologies are needed to break through these technological barriers and enable the substrate manufacturing of upcoming technology nodes. The core patterning step in the manufacturing of substrates typically utilizes a wet etch process, which comprises an impinging liquid spray of a copper etchant through a pressurized nozzle orifice onto predefined exposed copper regions bounded by a dry film resist (DFR) defined by a photolithographic step.

Traditionally, the field has focused on etching solutions based on either acidic etching (Cupric Chloride in hydrochloric acid) or alkaline etching (cupric chloride complexed with ammonia) for which, under conventional spray conditions, the etching process tends to be isotropic. Isotropic etching presents a fundamental limitation in the etch resolution capability as the etch depth is equal to the etch undercut for a perfectly isotropic case.

Preferential downward (anisotropic) etching is capable of achieving smaller space resolution than isotropic etching and can accommodate tighter core patterning design rules. Preferential downward etching is possible utilizing conventional technologies by implementing hydrodynamic conditions which promote non-uniform stirring along the surface resulting in non-uniform etching. This is achieved through judicious control of convective transport processes by tuning the DFR bias (e.g., DFR thickness and space aspect ratio), process dwell time (i.e., processing time), spray characteristics of the liquid etchant, and bath conditions (chemical concentrations, bath temperature, etc.) which under certain conditions create directionality to the etching process. This approach, however, is limited and alternative approaches need to be explored to improve etch resolution capability and meet upcoming design rules.

In addition, due to the limitations of current etching techniques 3, a critical dimension (CD) of the DFR must be made larger than the CD of metal features to compensate for undercuting that occurs beneath the DFR. A so called patterning bias must be used to compensate for the undercut and achieve the desired design feature size. The DFR thickness and space aspect ratio plays a key role in the flow dynamics inside the cavity, which significantly impact the etch resolution capability.

Thus, novel technologies that drive improvements in the subtractive etch resolution capability will be needed to enable the manufacturing of future technology nodes. Technologies are needed that enable preferential anisotropic etching that suppresses undercutting that occurs during metal etching.

DESCRIPTION OF THE EMBODIMENTS

Figure 1:
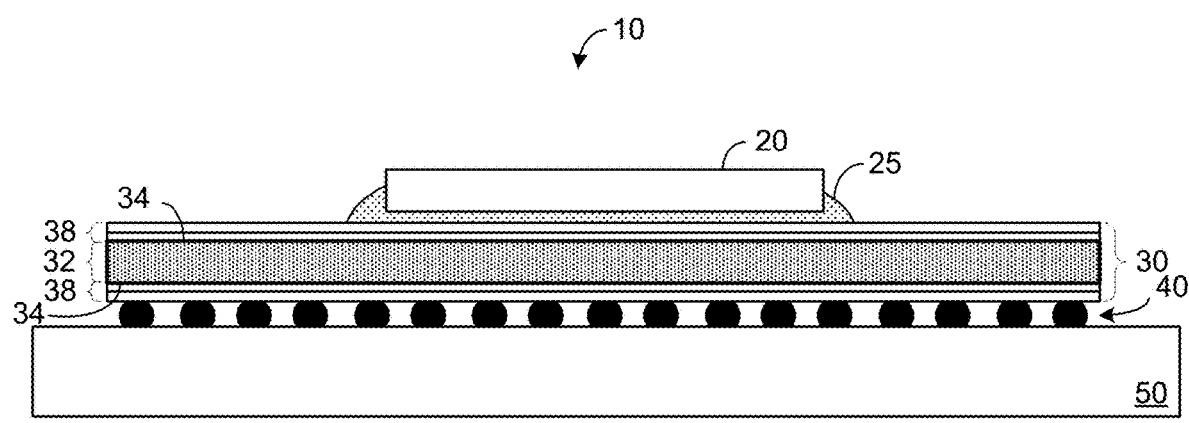
FIG. 1 is a cross-sectional side view of apparatus according to some embodiments.

Enhanced etch anisotropy using nanoparticles as banking agents in either the absence or presence of a magnetic or electrical field assisted copper etching is described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments described herein are directed to structures and architectures for fabricating circuitry lines and spaces, specifically for high density interconnects for wiring boards an integrated circuits such as chip scale packages and wafer level packages. Embodiments may include or pertain to one or more of the use of an enhanced anisotropic etching process using nanoparticles as banking agents either in the presence or absence of a magnetic or electrical field assisted metal etching. One or more embodiments may be implemented to realize high performance metal interconnects and substrate cores of future technology nodes.

To provide context, FIG. 1 is a cross-sectional side view of apparatus 10 according to some embodiments. Apparatus 10 includes integrated circuit die 20, integrated circuit package substrate 30, interconnects 40, and motherboard 50. Integrated circuit die 20 may include integrated electrical devices for providing microprocessor functionality and may be fabricated using any suitable materials and fabrication techniques. The electrical devices may reside between a substrate of integrated circuit die 20 and integrated circuit package substrate 30.

Substrate 30 includes integrated circuit package substrate core 32. Core 32 may comprise an inner core layer composed of a fiber-reinforced material, and outer core layer 34 comprising a metal interconnects. In some embodiments, outer core layer 34 comprises copper or other suitable metal, and may comprises an upper surface and a lower surface of core 32. Underfill material 25 encapsulates the electrical coupling between integrated circuit die 20 and integrated circuit package substrate 30. Integrated circuit package substrate 30 may comprise any ceramic, organic, and/or other suitable material. Integrated circuit package substrate 30 provides physical support to die 20 and also provides routing of power and signals between die 20 and motherboard 50. Build-up layers 38 may be fabricated on core 32. Build-up layers 38 may comprise conductive layers separated by dielectric layers. The conductive layers comprise reference planes for supplying reference voltages to electrical components that are connected to substrate 30, or routing layers including conductive traces for carrying electrical signals between such electrical components.

In the manufacture of integrated circuits, a metal film deposited on a semiconductor substrate must be etched to form the copper or other metal interconnects between semiconductor devices, e.g., on outer core layer 34. A common process for forming the metal interconnects may involve depositing a uniform layer of a metal conductor, such as copper or other conducting metal on a substrate. A mask layer is formed on the metal conductor with openings defined in the mask layer to expose portions of the metal layer. The mask layer may be formed by laminating a dry film resist (DFR) onto the metal conductor layer followed by performing a photolithographic process comprising masking, exposing, and DFR developing to provide a pattern of the desired circuitry over the metal conductor. Portions of the metal conductor not covered by the DFR are removed by wet etch process that impinges a liquid spray of a copper etchant through a pressurized nozzle orifice onto the exposed copper regions solutions. The etchant dissolves the exposed copper, thereby transferring the pattern to the copper to form interconnects.

Traditionally, the wet etch is based on either acidic etching (Cupric Chloride in hydrochloric acid) or alkaline etching (cupric chloride complexed with ammonia). Typically, under conventional spray conditions, the etching process tends to be isotropic.

Figure 2A:
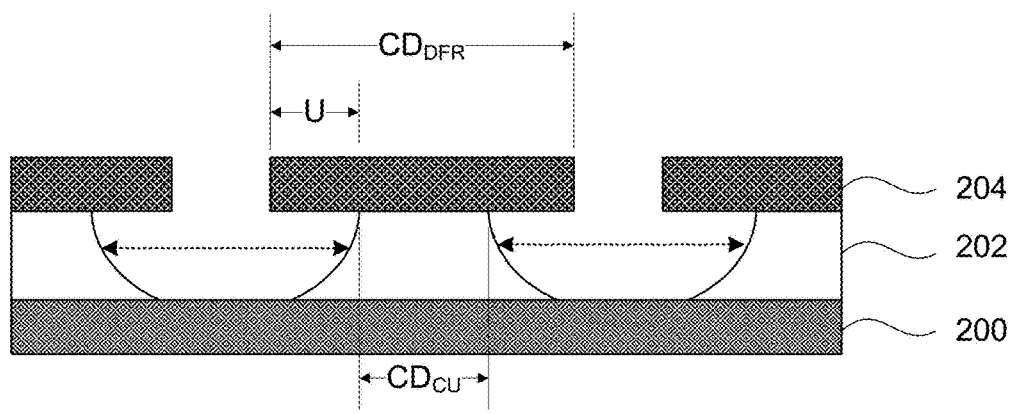
FIGS. 2A and 2B illustrate results of the isotropic etch process on a metal conductor.
Figure 2B:
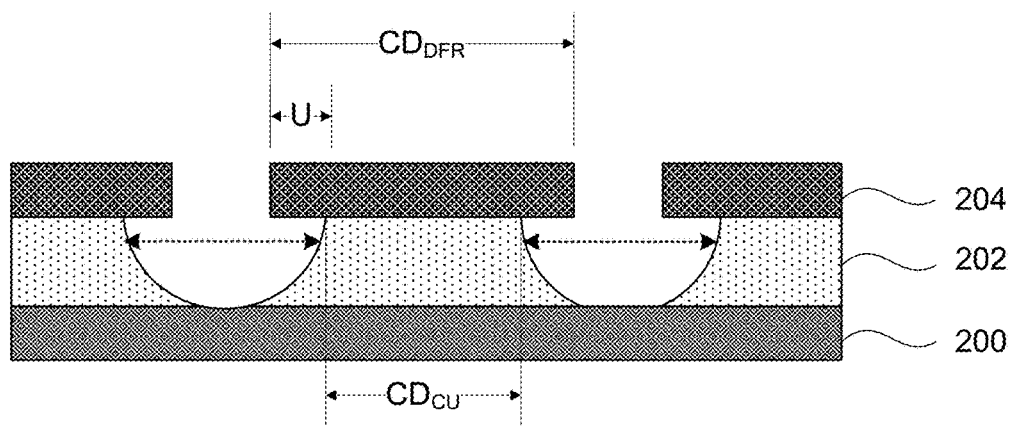

FIGS. 2A and 2B illustrate results of the isotropic etch process on the metal conductor. FIG. 2A shows a substrate 200 coated with a metal layer 202, e.g., copper, and a DFR layer 204 over the metal layer 202. The DFR layer 204 has been processed to transfer a pattern to the metal layer 202 using known lithographic techniques. A wet etchant has been used to etch exposed portions of the metal layer 202.

Ideally, the etch process would only remove portions of the metal layer 202 under exposed regions of the DFR layer 204. That is, a critical dimension of the DFR ($CD_{DFR}$) is the width of a portion of DFR layer 204 and represents the desired metal conductor width after removal of the exposed part of the metal layer. A critical dimension of a copper feature ($CD_{CU}$) is the metal conductor width after removal of the exposed part of the metal layer. An ideal etch would result in $CD_{DFR}$ and $CD_{CU}$ being equal.

However, during removal of the exposed part of the metal layer 202, the depth of the metal removal proceeds vertically, and sidewalls of the exposed metal conductor also etch laterally to produce an undercut beneath the DFR layer 204, the width of which is referred to as the etch undercut width 'U'. Isotropic etching limits such resolution capability as the etch undercut depth is equal to the etch undercut 'U' in a perfectly isotropic case. Due to these limitations, a critical dimension of the DFR ($CD_{CU}$) must be made larger than the CD of metal features ($CD_{CU}$) to compensate for undercutting. A so called patterning bias must be used to compensate for the undercut and achieve the desired design feature size.

An anisotropic etch process offers an improvement over isotropic etching, as shown in FIG. 2B. FIG. 2B illustrates results of the anisotropic etch process on the metal conductor. As shown, preferential downward (anisotropic) etching is capable of achieving smaller space resolution compared to isotropic etching and can accommodate tighter core patterning design rules. This approach, however, is limited in that significant undercutting may still result.

In addition to a fluid mechanical approach described above, some chemical approaches have been introduced into the field recently, including the use of banking agents. Banking agents suppress undercut by forcing insoluble chemical additives (banking agents) to aggregate to the top of the channel via convection currents inside the cavity. The banking agents then act as an etch barrier resulting in suppressed undercut. Without such banking agents, the etching tends to develop within the isotropic limit regime. For example, a banking agent may comprise an active etchant such as Cu2+, an inhibitor, and a spent etchant such as Cu+/CuCl, where convection currents direct insoluble banking agents, i.e., the inhibitor and the spent etchant, to the sides of the channel to provide a protective film of poorly-soluble compounds that suppresses etching of the sidewalls.

Figure 2C:
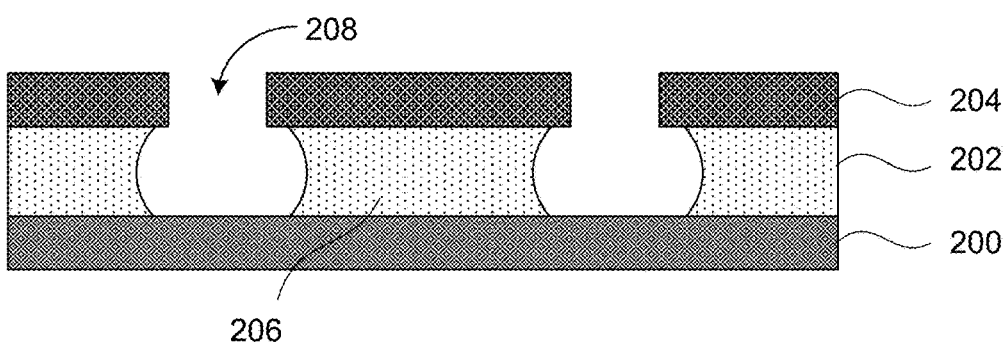
FIG. 2C illustrates results of the wet etch process on the metal conductor using banking agents.

FIG. 2C illustrates results of the wet etch process on the metal conductor using commercially available banking agents. While the use of available banking agents may result in metal conductors 206 having smaller pitch sizes, such banking agents tend to cause aggregation of the insoluble banking agents predominantly at the top of the channels 208 forming the metal conductor 206, creating a poor metal conductor 206 profile that has an hour glass shape. As a result, only modest aspect ratios between 1.25 and 1.4 (Cu Space: Thickness) are achieved. And because the insoluble additives tend to act as an etch barrier, the banking agents also result in a reduced etch rate, including the bottom of the channel where high etch rate is desired.

In accordance with one or more embodiments described herein, improved etch resolution capability is achieved through the use of an enhanced anisotropic etching (preferential downward etching) process using improved banking agent materials and processes that enable deeper aspect ratios and straighter metal conductor profiles.

In a first aspect, the enhanced anisotropic etching process is performed utilizing an active etching solution (i.e., comprising an active etchant) that includes nanoparticles as an insoluble banking agent. Nanoparticles are particles ranging between 1 and 100 nm in size with a surrounding interfacial layer. The interfacial layer is an integral part of nanoscale matter that affects properties or the nanoparticles. In one embodiment, the nanoparticles refer to inorganic materials, but may also include organic materials.

In one embodiment, a set of nanoparticles is selected that has a tunable size distribution. For example, a set of nanoparticles may be selected to enable tuning of an effective barrier depth of the banking agent beneath overhanging DFR.

Figure 3:
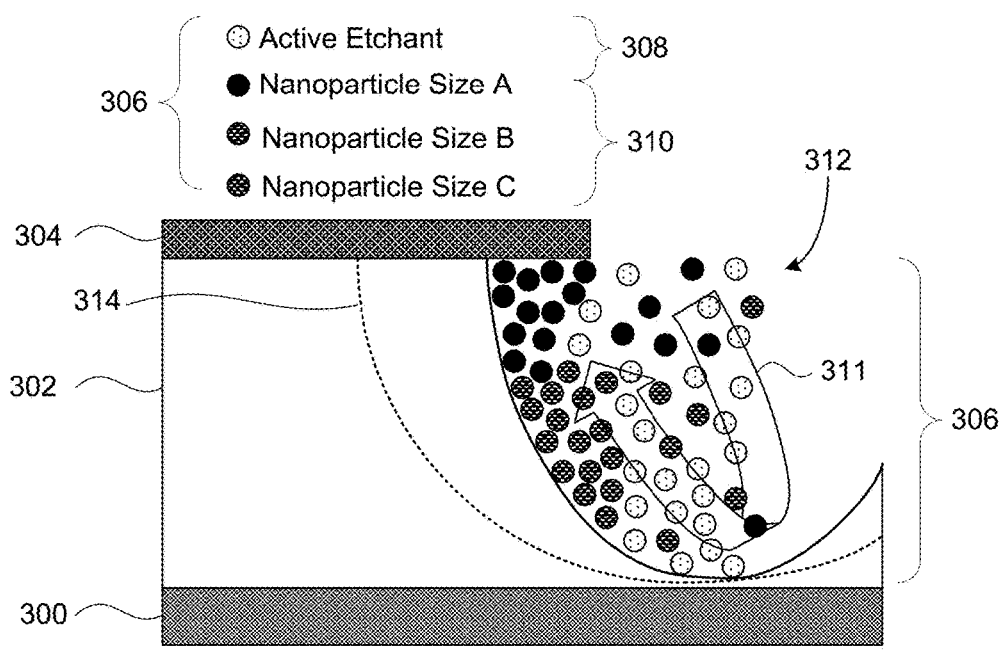
FIG. 3 illustrates an enhanced anisotropic etching process utilizing a banking agent solution comprising a set of silicon nanoparticles according to the disclosed embodiments.

FIG. 3 illustrates an enhanced anisotropic etching process utilizing a banking agent solution comprising a set of nanoparticles according to the disclosed embodiments. FIG. 3 shows the enhanced anisotropic etching process performed in progress on a substrate 300 coated with a metal layer 302 (copper) and a mask layer 304 (e.g., DFR) over the metal layer 302 that transfers a pattern to the metal layer 302. An active etching solution 306 is introduced in an opening in the mask layer 304 to etch the metal layer 302, which forms a channel 312 defined by sidewalls of the metal layer 302.

According to one embodiment, the etching solution 306 is formed with an active etchant 308 and a set of insoluble nanoparticles 310 having varying sized diameters as the banking agent. In the example shown, the set of insoluble nanoparticles 310 comprises nanoparticles of size A, nanoparticles of size B, and nanoparticles of size C. As an example embodiment, the nanoparticles of size A may have an outer diameter ranging from 61-100 nm, nanoparticles of size B, may have an outer diameter ranging from 36-60 nm, and nanoparticles of size C may have an outer diameter ranging from 1-35 nm.

In one embodiment the nanoparticles 310 may comprise at least one of Silicon, Titanium, Silver, Gold, Carbon (including fullerenes and CNTs), Tin, Lead, Zinc, Magnesium, Germanium, Chromium, Tantalum, platinum, oxides thereof (i.e., $SiO_2$, $TiO_2$, etc.), as well as alloys thereof, and alloys with magnetically sensitive metals (e.g., Nickel, Iron, Cobalt).

The etching solution 306 suppresses undercut caused by the active etchant by forcing the insoluble set of nanoparticles 310 to aggregate to the top of the channel 312 and along the sidewalls via convection currents 311 where the nanoparticles 310 act as an etch barrier to suppress undercut 308. As shown, the resulting enhanced anisotropic etch results in an improved metal profile compared to an isotropic etch profile 314 shown with the dotted line.

In one embodiment, the composition and size of the nanoparticles 310 (and optionally the active etchant 308) may be optimized to balance factors such as buoyancy, drag and gravitational forces. The size (i.e., diameter) selected for of the nanoparticles 310 has a significant influence on the particles mass transport inside the etching channel 312 (on account of varying drag, buoyancy, and gravitational forces with respect to nanoparticle size). A suitable size distribution may enable a uniform aggregation of nanoparticles 310 beneath the overhanging mask layer 304 (larger effective barrier depth along the sidewall) resulting in improved metal profiles and better anisotropic etching through proper balance of buoyancy force, drag force and gravitational forces. Such a mechanism would be comparable to a fluidized bed wherein buoyancy force, drag forces, and gravity are balanced in such a way that the spatial distribution of the solute (in this case banking agent) is lengthened parallel to the fluid flow direction. A lengthened distribution may be ideal for more uniform coverage along the sidewall and beneath the overhanging mask layer 304.

Figure 4:
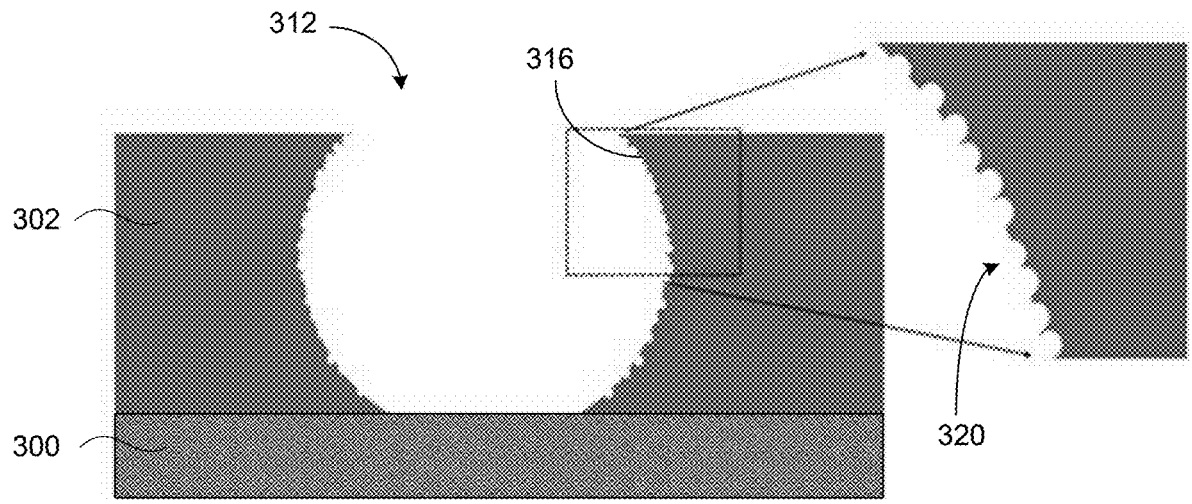
FIG. 4 illustrates a cross-sectional of the substrate, the metal layer, and a larger view of a portion of a sidewall after completion of the enhanced antistrophic etch process.

FIG. 4 illustrates a cross-sectional of the substrate 300, the metal layer 302, and a larger view of a portion of a sidewall 316 after completion of the enhanced antistrophic etch process. As shown, the use of the etching solution 306 comprising the active etchant 308 and the insoluble various sized nanoparticles 310 is likely to form crater type structures 320 in the sidewalls 316 of the channel 312 and the resulting metal feature. The size of the craters 320 is dependent on the size of the nanoparticles 310.

One significant advantage of the use of nanoparticles 310 over existing banking agents is that the size distribution of the nanoparticle 310 can be easily tuned. Thus, such an approach would enable an additional dimension of optimization and potentially enable tuning of the effective barrier depth of the banking agent beneath the overhanging resist. Another advantage is that the enhanced anisotropic etch results in more uniform aggregation of insoluble particles along sidewalls 316 of the channel 312 and does not reduce the etching rate at the bottom of the channel.

In a second aspect of the disclosed embodiments, the enhanced anisotropic etching process is performed utilizing magnetic field assisted metal etching. Etch resolution capability is improved by the enhanced anisotropic etching (preferential downward etching) through a magnetic field assisted etching process. In one embodiment, any type of the etchant solution combined with a magnetically sensitive banking agent may be used. In one embodiment, an alkaline based etchant (e.g., cupric chloride complexed with ammonia) combined with a banking agent of magnetically sensitive nanoparticles is exposed to a magnetic field perpendicular to the etching plane.

Figure 5:
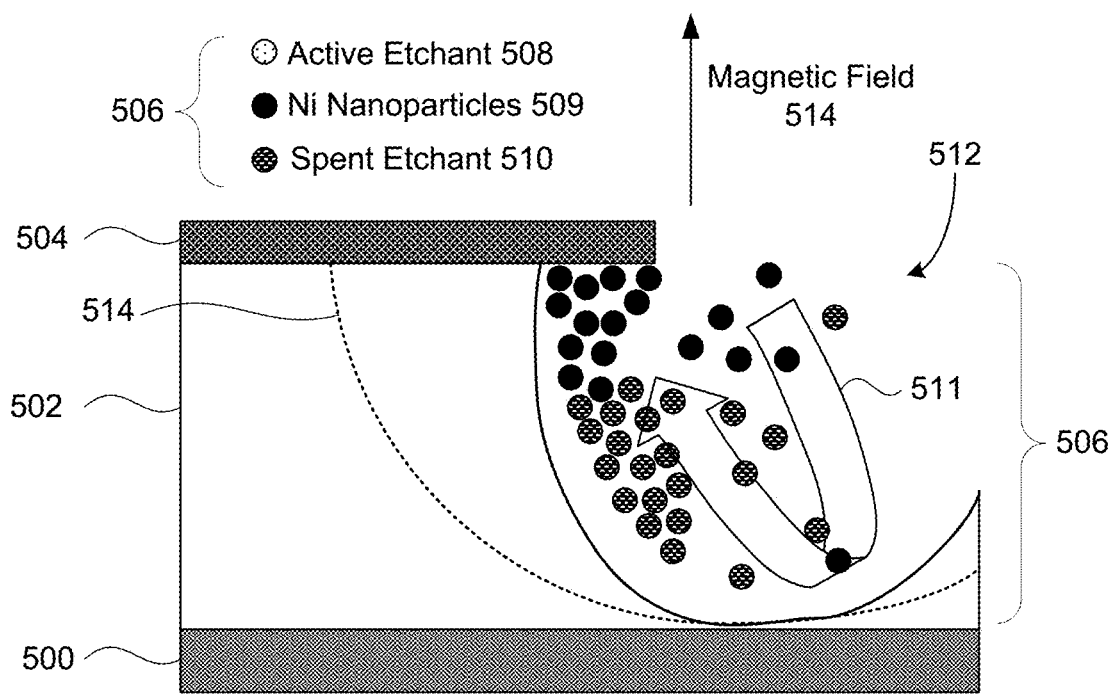
FIG. 5 illustrates an enhanced anisotropic etching process utilizing a banking agent solution comprising a set of nanoparticles according to the disclosed embodiments.

FIG. 5 illustrates an enhanced anisotropic etching process utilizing a banking agent solution comprising a set of nanoparticles according to the disclosed embodiments. FIG. 5 shows the enhanced anisotropic etching process performed in progress on a substrate 500 coated with a metal layer 502 (e.g., copper) and a mask layer 504 (e.g., DFR) over the metal layer 502. FIG. 5 shows a banking agent solution 506 introduced in an opening in the mask layer 504 to etch the metal layer 502, which forms a channel 512 defined by sidewalls of the metal layer 502.

According to one embodiment, the etching solution 506 may comprise an alkaline etch solution with an active etchant 508, spent etchant 510, and nanoparticles 509 that are insoluble and magnetically sensitive. In one embodiment, nanoparticles 509 may comprise at least one of nickel, iron, cobalt, and their alloys. In one embodiment, a spray or laminar film-type chemical delivery may be used. While in the channel 512, the etching solution 506 is exposed to a magnetic field 514 having a direction (shown by the arrow) perpendicular to the etching plane.

The magnetically sensitive and insoluble nickel nanoparticles 509 are directed into the side of the channel via convection currents 511. A magnetic force from the magnetic field 514 further pins the nickel nanoparticles 509 beneath the overhanging mask layer and along upper side walls with sustained dwell time at the side walls. The convection currents 511 also direct the spent etchant 510 to the sidewalls of the channel 512. The magnetic field 514 coupled with convection currents 511 results in significant aggregation of insoluble materials at the sidewalls, where the nickel nanoparticles 509 and the spent etchant 510 act as an etch barrier from the active etchant to suppress undercut 508. Additionally, the magnetic field 514 forces any nickel nanoparticles 509 at the bottom of the channel 512 upward and enhance the etch rate at the bottom of the channel 512, resulting in a larger vertical to lateral etch rate ratio. As shown, the resulting enhanced anisotropic etch results in an improved metal profile compared to an isotropic etch profile 514 shown with the dotted line.

Figure 6:
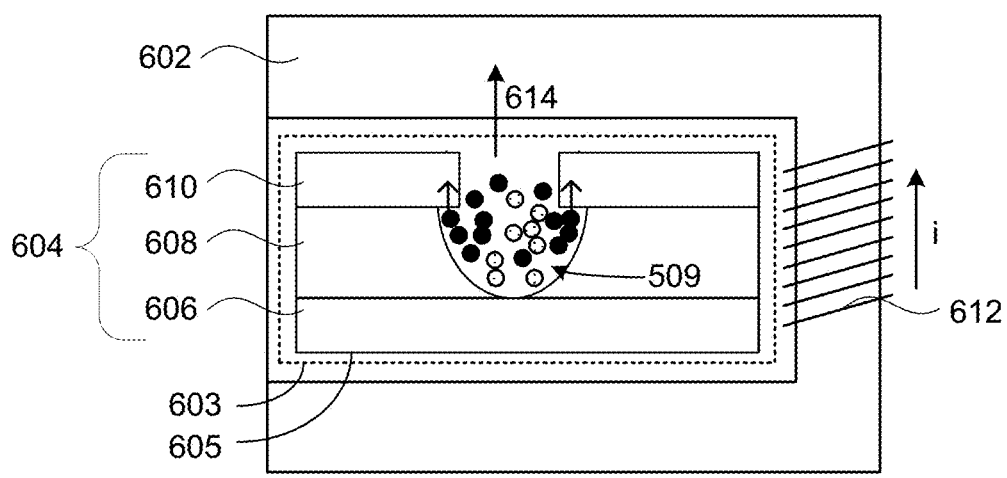
FIG. 6 illustrates a system for establishing a uniform magnetic field according to one embodiment.

FIG. 6 illustrates a system for establishing a uniform magnetic field according to one embodiment. In one embodiment, the system 600 includes an electromagnetic core 602 having an etch chamber 603 and a solution container 605 containing the etching solution 506. A panel 604 comprising the substrate 606, the metal layer 608, and the mask layer 610, is inserted into the solution container 605 and the solution container 605 is inserted into the etch chamber 603. In one embodiment, the mask layer 610 may comprises a dry film resist, and the metal layer may comprise copper or other suitable metal.

In operation, a current (i) flows through the electric coil 612 counterclockwise with respect to the etching plane (when facing the etching plane). This causes the electric coil 612 to propagate a uniform magnetic field 614 through the electromagnetic core 602 and inside an air gap of the etch chamber 603. The etching process is performed only on one side (top or bottom) of the panel 604 at a given time as the magnetic field 612 direction must be opposite to the etching direction. The magnitude of the current (i) modulates a B-field intensity of the magnetic field 614, and the direction current 612 modulates the magnetic field 614 direction. The B field intensity pins the nickel nanoparticles 509 against the bottom of the mask layer 610 and sides of the channel.

By implementing nickel nanoparticles 509 in the etching solution 506 and exposing the solution to a perpendicular magnetic field 614, a significant reduction in the etch undercut results due to (1) significant aggregation of the insoluble and magnetically sensitive nickel particles 509 beneath the mask layer 610 and along the top of the sidewalls, and (2) a reduced aggregation of insoluble agents at the bottom of the channel but a higher concentration of the active etchant 508 at the bottom of the channel to increase the etch rate. Note, the etch process is shown in FIG. 6 is only partially complete.

The enhanced anisotropic etching process utilizing a nickel nanoparticles-based banking agent with magnetic field assisted metal etching is superior to existing banking agent solutions as it employs magnetically sensitive banking agents, i.e., the nickel nanoparticles, in a magnetic field perpendicular to the etching plane to drive etch anisotropy, which results in more significant and uniform aggregation at the channel sidewall.

In a third aspect of the disclosed embodiments, etch resolution capability is improved over a standard acidic copper etch process that uses a $CuCl_2$ based etchant by enhancing the anisotropic etching through an electric field assisted etching process. In particular, by introducing exposed portions of the copper layer to the a wet etchant, which may be $CuCl_2$ based, and an electric field perpendicular to the etching plane, electric charges aggregate along the etching cavity sidewall. Such a charge aggregation slows the etching rate at the etching cavity sidewall, resulting in preferential downward etching by suppressing undercut.

The proposed solution approaches the problem in a fundamentally unique way. By implementing an electric field perpendicular to the etching plane electric charges would aggregate along the etching cavity side wall. The charges (either negative or positive) would inhibit the etching reaction. Specifically, since the etching of copper depends both on the concentration of active etchant ($Cu_2+$) and the regeneration of a spent etchant (Cu+/CuCl), a sustained localized aggregation of negative charges would suppress reaction rate by preventing regeneration (Cl-interaction) and keeping spent etchant (Cu+) at the undersurface of the copper, while sustained localized positive charges suppress reaction rate by preventing the active etchant (Cu2+) from contacting the undersurface of the copper layer.

The etching reaction is $CuCl_2+Cu \rightarrow 2CuCl$, and the regeneration reaction is $2CuCl+H_2O_2+2HCl \rightarrow 2CuCl_2+H_2O_2$. Cupric chloride ($CuCl_2$) reacts with copper to form cuprous chloride (CuCl). The inactive reaction product, CuCl, can be converted back to an active etchant ($CuCl_2$) by following a chlorination step, as chloride readily oxidizes cuprous chloride to cupric chloride. One common approach for chlorination or regeneration is incorporating solutions of hydrogen peroxide and hydrochloric acid.

In a fourth embodiment, the second and third embodiment are combined to provide an enhanced anisotropic etching process utilizing an active etchant solution having magnetically sensitive nanoparticles and exposing the active etchant to both a magnetic field and an electrical field.

Figure 7:
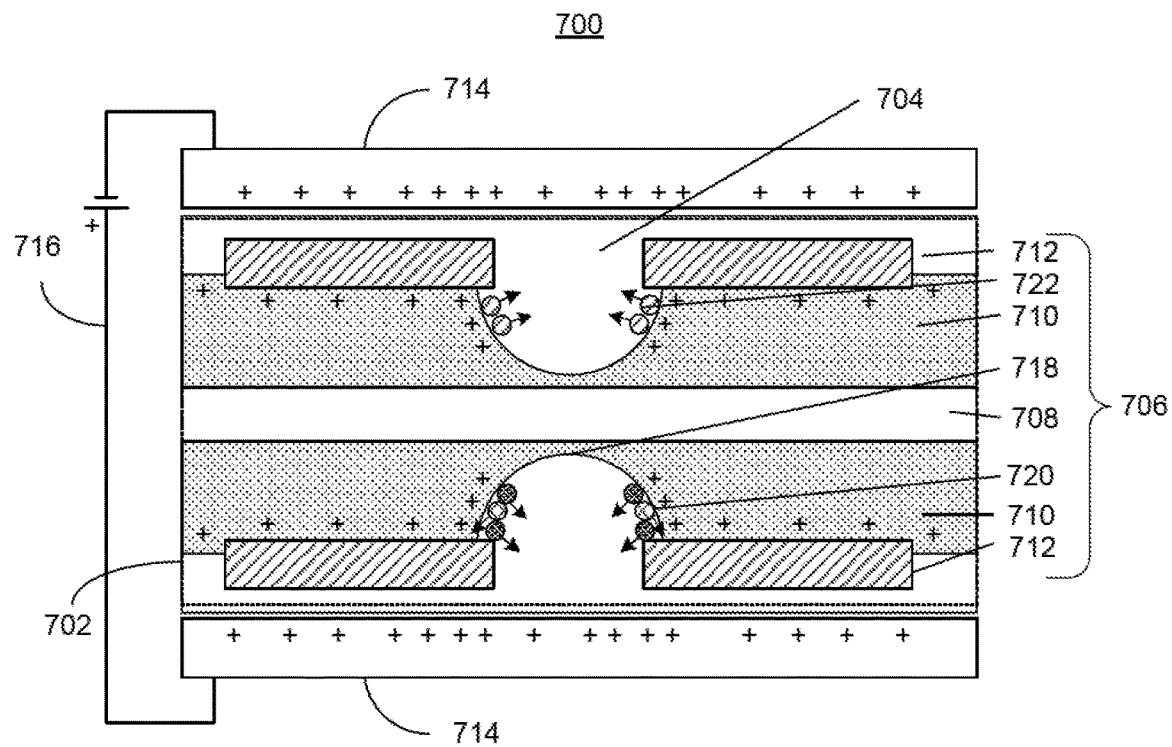
FIG. 7 illustrates a system for enhanced anisotropic etching process utilizing electric field assisted etching according to one embodiment.

FIG. 7 illustrates a system for enhanced anisotropic etching process utilizing electric field assisted etching according to one embodiment. In one embodiment, the system 700 includes a solution container 702 containing an etching solution 704. A panel 706 is inserted into the solution container 702. The panel comprises a substrate 708, a copper layer 710 on both sides of the substrate 708, and a mask layer 712 over the copper layer 710. The solution container 702 with the panel 706 are inserted into an etch chamber comprising two parallel plates 714, where one plate 714 is adjacent to the top side of the panel 706 and the other plate 714 is adjacent to the bottom side of the panel 706. In one embodiment, the mask layer 610 may comprises a dry film resist.

In operation, the system 700 establishes the electric field by induction. Specifically, a voltage potential 716 is applied across the two parallel plates 714 encompassing the panel 706, an electric field is generated perpendicular to the etching plane. As a result of the electric field, charges collect predominantly near the undercut locations of the copper cavity 718 where etch rate inhibition is desired. Such charge aggregation, slows the etching reaction at the undercut locations. Specifically, a sustained localized aggregation of negative charges 720 would suppress reaction rate by preventing the regeneration (Cl– interaction) and keeping spent etchant (Cu+) at the surface of the copper 712, while sustained localized positive charges 722 suppress the reaction rate by preventing active etchant (Cu2+) from contacting the surface of the copper 712. The charge aggregation can be easily tuned by adjusting the voltage for optimal coverage of the sidewall.

Figure 8:
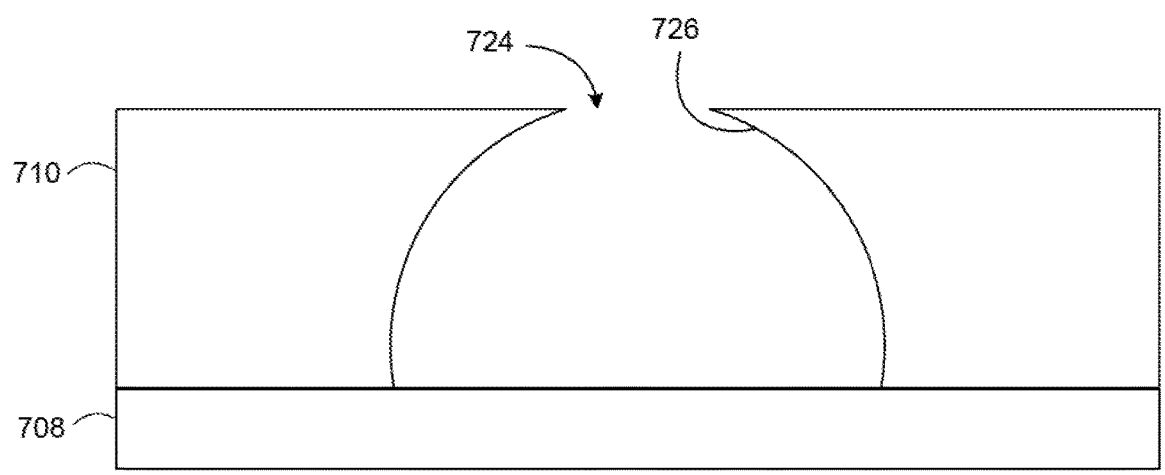
FIG. 8 illustrates a cross-sectional of the substrate, a copper layer, and the mask layer after completion of the electric field assisted enhanced antistrophic etch process.

FIG. 8 illustrates a cross-sectional of the substrate 708, a copper layer 710, and the mask layer 610 after completion of the electric field assisted enhanced antistrophic etch process. Because the electric field results in a charge build up predominantly at a top of the copper feature, a strongly suppressed undercut results with a gradual reduction in undercut suppression along sidewalls 724 of the copper 710 from top to bottom of the channel 726. As shown, the location of the largest open occurs at the bottom of the copper feature, which is not typically the case for standard etched features.

Figure 9:
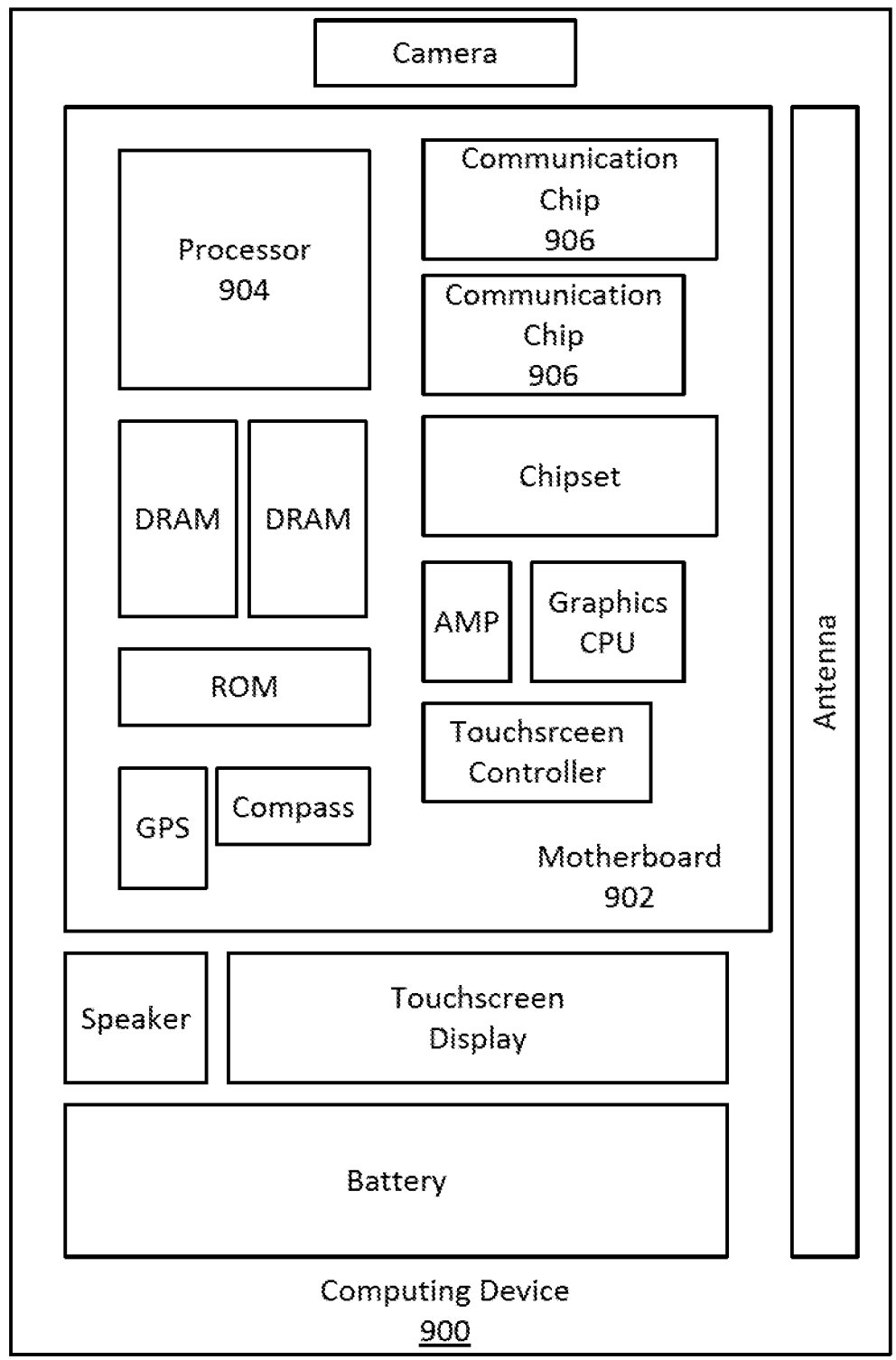
FIG. 9 illustrates a computing device in accordance with one implementation of the disclosure.

FIG. 9 illustrates a computing device 900 in accordance with one implementation of the disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the disclosure, the integrated circuit die of the processor includes one or more thin film transistors having relatively increased width, in accordance with implementations of embodiments of the disclosure. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of embodiments of the disclosure, the integrated circuit die of the communication chip includes copper or other metal interconnects formed with an enhanced anisotropic etch, in accordance with implementations of embodiments of the disclosure.

In further implementations, another component housed within the computing device 900 may contain an integrated circuit die that includes one or more copper or other metal interconnects formed with an enhanced anisotropic etch, in accordance with implementations of embodiments of the disclosure.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: A method of anisotropic etching comprises forming a metal layer above a substrate. A mask layer is formed on the metal layer with openings defined in the mask layer to expose portions of the metal layer. The exposed portions of the metal layer are introduced to an active etching solution including nanoparticles as an insoluble banking agent.

Example embodiment 2: The embodiment of claim 1, wherein the nanoparticles comprise at least one of Silicon, Titanium, Silver, Gold, Carbon, Tin, Lead, Zinc, Magnesium, Germanium, Chromium, Tantalum, platinum, oxides thereof, alloys thereof, and alloys with magnetically sensitive metals including Nickel, Iron, and Cobalt.

Example embodiment 3: The embodiment of claim 1 or 2, wherein introducing the exposed portions of the metal layer to active etching solution forms crater structures in sidewalls of the metal layer.

Example embodiment 4: The embodiment of claim 1, 2, or 3 further comprising using a set of insoluble nanoparticles having varying sized diameters.

Example embodiment 5: The embodiment of claim 1, 2, 3 or 4, further comprising suppressing undercut of the mask layer by the active etching solution by forcing the set of insoluble nanoparticles to aggregate to a top of a channel via convection currents where the nanoparticles act as an etch barrier.

Example embodiment 6: The embodiment of claim 1, 2, 3, 4 or 5, further comprising selecting a set of nanoparticles that has a tunable size distribution.

Example embodiment 7: The embodiment of claim 1, 2, 3, 4, 5 or 6, further comprising selecting the set of nanoparticles to enable tuning of a barrier depth of the banking agents beneath the mask layer.

Example embodiment 8: The embodiment of claim 1, 2, 3, 4, 5, 6 or 7, further comprising optimizing a composition and a size of the nanoparticles to balance buoyancy, drag and gravitational forces.

Example embodiment 9: The embodiment of claim 1, 2, 3, 4, 5, 6, 7 or 8, further comprising using a dry film resist (DFR) as the mask layer and copper as the metal layer.

Example embodiment 10: The embodiment of claim 1, further comprising utilizing magnetically sensitive nanoparticles as the insoluble banking agent.

Example embodiment 11: The embodiment of claim 10, wherein the active etching solution is exposed to a magnetic field that is perpendicular to an etching plane.

Example embodiment 12: The embodiment of claim 10 or 11, further comprising forming the active etching solution with spent etchant and the magnetically sensitive nanoparticles.

Example embodiment 13: The embodiment of claim 10, 11, or 12, further comprising suppressing undercut under the mask layer by the active etchant by directing the magnetically sensitive nanoparticles to aggregate to a top of a channel via convection currents, and using a magnetic force from the magnetic field to pin the magnetically sensitive nanoparticles beneath the mask layer and along upper side walls of the channel.

Example embodiment 14: The embodiment of claim 10, 11, 12, or 13, further comprising using the magnetically sensitive nanoparticles and the spent etchant as an etch barrier to the active etchant to suppress undercut.

Example embodiment 15: The embodiment of claim 10, 11, 12, 13, or 14, further comprising:
establishing the magnetic field by inserting a panel comprising the substrate, the metal layer, and the mask layer into an etch chamber of an electromagnetic core having an electric coil; and flowing a current through the electric coil to propagate the magnetic field through the electromagnetic core inside in the etch chamber.

Example embodiment 16: The embodiment of claim 10, 11, 12, 13, 14, or 15, further comprising using a dry film resist (DFR) as the mask layer, copper as the metal layer, wherein the magnetically sensitive nanoparticles comprise at least one of nickel, iron, cobalt, and alloys thereof.

Example embodiment 17: The embodiment of claim 10, 11, 12, 13, 14, 15, or 16, further comprising exposing the active etchant having the magnetically sensitive nanoparticles to both a magnetic field and an electrical field.

Example embodiment 18: A method of anisotropic etching comprises forming a copper layer above a substrate. A mask layer is formed on the copper layer with openings defined in the mask layer to expose portions of the copper layer. The exposed portions of the copper layer are exposed to a wet etchant and an electric field perpendicular to an etching plane.

Example embodiment 19: the embodiment of claim 18, wherein the electric field causes charges to aggregate along an etching cavity sidewall to slow an etching rate at the sidewall, resulting in preferential downward etching by suppressing undercut.

Example embodiment 20: the embodiment of claim 18 or 19, further comprising using sustained localized aggregation of negative charges to suppress a reaction rate by preventing regeneration and keeping spent etchant at an undersurface of the copper layer, while sustained localized positive charges suppress the reaction rate by preventing an active etchant from contacting the undersurface of copper layer.

Example embodiment 21: the embodiment of claim 18, 19 or 20, further comprising: establishing the electric field by inserting a panel comprising the substrate, the copper layer, and the mask layer into an etch chamber of an electromagnetic core comprising two parallel plates; and applying a voltage potential across the two parallel plates to generate an electric field perpendicular to an etching plane.

Example embodiment 22: the embodiment of claim 18, 19, 20, or 21, wherein the wet etchant comprises a $CuCl_2$ based etchant comprising an active etchant ($Cu2+$) and a spent etchant ($Cu+/CuCl$).

Example embodiment 23: the embodiment of claim 18, 19, 20, 21 or 22, wherein an etching reaction comprises $CuCl_2+Cu \rightarrow 2CuCl$, and a regeneration reaction comprises $2CuCl+H_2O_2+2HCl \rightarrow 2CuCl_2+H_2O_2$.

Example embodiment 24: a method of anisotropic etching comprises forming a metal layer above a substrate. A mask layer is formed on the metal layer with openings defined in the mask layer to expose portions of the metal layer. The exposed portions of the metal layer are introduced to an active etching solution including magnetically sensitive nanoparticles as an insoluble banking agent. The active etching solution is exposed to a magnetic field that is perpendicular to an etching plane. The active etching solution is also exposed to an electric field perpendicular to the etching plane.

Example embodiment 25: the embodiment of claim 24, further comprising using the magnetically sensitive nanoparticles and spent etchant as an etch barrier to an active etchant to suppress undercut.

What is claimed is:

1. A method of anisotropic etching, the method comprising:
   forming a metal layer above a substrate;
   forming a mask layer on the metal layer with openings defined in the mask layer to expose portions of the metal layer; and
   introducing the exposed portions of the metal layer to active etching solution including nanoparticles as an insoluble banking agent.

2. The method of claim 1, wherein the nanoparticles comprise at least one of Silicon, Titanium, Silver, Gold, Carbon, Tin, Lead, Zinc, Magnesium, Germanium, Chromium, Tantalum, platinum, oxides thereof, alloys thereof, and alloys with magnetically sensitive metals including Nickel, Iron, and Cobalt.

3. The method of claim 1, wherein introducing the exposed portions of the metal layer to active etching solution forms crater structures in sidewalls of the metal layer.

4. The method of claim 1, further comprising using a set of insoluble nanoparticles having varying sized diameters.

5. The method of claim 4, further comprising suppressing undercut of the mask layer by the active etching solution by forcing the set of insoluble nanoparticles to aggregate to a top of a channel via convection currents where the nanoparticles act as an etch barrier.

6. The method of claim 1, further comprising selecting a set of nanoparticles that has a tunable size distribution.

7. The method of claim 6, further comprising selecting the set of nanoparticles to enable tuning of a barrier depth of the banking agents beneath the mask layer.

8. The method of claim 1, further comprising optimizing a composition and a size of the nanoparticles to balance buoyancy, drag and gravitational forces.

9. The method of claim 1, further comprising using a dry film resist (DFR) as the mask layer and copper as the metal layer.

10. The method of claim 1, further comprising utilizing magnetically sensitive nanoparticles as the insoluble banking agent.

11. The method of claim 10, wherein the active etching solution is exposed to a magnetic field that is perpendicular to an etching plane.

12. The method of claim 10, further comprising forming the active etching solution with spent etchant and the magnetically sensitive nanoparticles.

13. The method of claim 10, further comprising suppressing undercut under the mask layer by the active etchant by directing the magnetically sensitive nanoparticles to aggregate to a top of a channel via convection currents, and using a magnetic force from the magnetic field to pin the magnetically sensitive nanoparticles beneath the mask layer and along upper side walls of the channel.

14. The method of claim 13, further comprising using the magnetically sensitive nanoparticles and the spent etchant as an etch barrier to the active etchant to suppress undercut.

15. The method of claim 10, further comprising:
establishing the magnetic field by inserting a panel comprising the substrate, the metal layer, and the mask layer into an etch chamber of an electromagnetic core having an electric coil; and
flowing a current through the electric coil to propagate the magnetic field through the electromagnetic core inside in the etch chamber.

16. The method of claim 10, further comprising using a dry film resist (DFR) as the mask layer, copper as the metal layer, wherein the magnetically sensitive nanoparticles comprise at least one of nickel, iron, cobalt, and alloys thereof.

17. The method of claim 10, further comprising exposing the active etchant having the magnetically sensitive nanoparticles to both a magnetic field and an electrical field.

18. A method of anisotropic etching, the method comprising:
forming a copper layer above a substrate;
forming a mask layer on the copper layer with openings defined in the mask layer to expose portions of the copper layer;
introducing the exposed portions of the copper layer to a wet etchant and an electric field perpendicular to an etching plane, wherein the electric field is established by:
inserting a panel comprising the substrate, the copper layer, and the mask layer into an etch chamber of an electromagnetic core comprising two parallel plates; and
applying a voltage potential across the two parallel plates to generate an electric field perpendicular to an etching plane.

19. The method of claim 18, wherein the wet etchant comprises a $CuCl_2$ based etchant comprising an active etchant (Cu2O) and a spent etchant (Cu+/CuCl).

20. The method of claim 19, wherein an etching reaction comprises $CuCl_2+Cu \rightarrow 2CuCl$, and a regeneration reaction comprises $2CuCl+H_2O_2+2HCl \rightarrow 2CuCl_2+H_2O_2$.

21. The method of claim 18, wherein the electric field causes charges to aggregate along an etching cavity sidewall to slow an etching rate at the sidewall, resulting in preferential downward etching by suppressing undercut.

22. The method of claim 21, further comprising using sustained localized aggregation of negative charges to suppress a reaction rate by preventing regeneration and keeping spent etchant at an undersurface of the copper layer, while sustained localized positive charges suppress the reaction rate by preventing an active etchant from contacting the undersurface of copper layer.

23. A method of anisotropic etching, the method comprising:
forming a metal layer above a substrate;
forming a mask layer on the metal layer with openings defined in the mask layer to expose portions of the metal layer; introducing the exposed portions of the metal layer to active etching solution including magnetically sensitive nanoparticles as an insoluble banking agent;
exposing the active etching solution to a magnetic field that is perpendicular to an etching plane; and
exposing the active etching solution to an electric field perpendicular to the etching plane.

24. The method of claim 23, further comprising using the magnetically sensitive nanoparticles and spent etchant as an etch barrier to an active etchant to suppress undercut.

* * * * *